United States Patent
Van Antwerpen et al.

(10) Patent No.: US 11,385,829 B2
(45) Date of Patent: Jul. 12, 2022

(54) MEMORY CONTROLLER FOR NON-INTERFERING ACCESSES TO NONVOLATILE MEMORY BY DIFFERENT MASTERS, AND RELATED SYSTEMS AND METHODS

(71) Applicant: Cypress Semiconductor Corporation, San Jose, CA (US)

(72) Inventors: Hans Van Antwerpen, Mountain View, CA (US); Morgan Andrew Whately, San Francisco, CA (US); Cliff Zitlaw, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 96 days.

(21) Appl. No.: 16/719,465

(22) Filed: Dec. 18, 2019

(65) Prior Publication Data

US 2021/0042054 A1 Feb. 11, 2021

Related U.S. Application Data

(60) Provisional application No. 62/883,019, filed on Aug. 5, 2019.

(51) Int. Cl.
*G06F 3/06* (2006.01)
*H04J 3/00* (2006.01)

(52) U.S. Cl.
CPC .......... *G06F 3/0655* (2013.01); *G06F 3/0604* (2013.01); *G06F 3/0679* (2013.01); *H04J 3/00* (2013.01)

(58) Field of Classification Search
None
See application file for complete search history.

(56) References Cited

U.S. PATENT DOCUMENTS

2006/0047919 A1* 3/2006 Jenkins ............... G06F 13/1652
711/150
2006/0267929 A1 11/2006 Obradovich
(Continued)

OTHER PUBLICATIONS

Hassan et al."A Framework for scheduling DRAM Memory Accesses for Multi-Core Mixed-Time Critical Systems." In: in proceedings of the IEEE Real-Time and Embedded Technology and Applications Symposium (RTAS), 2015, (online) (retrieved on Oct. 5, 2020 (Oct. 5, 2020) Retrieved from the internet.
(Continued)

*Primary Examiner* — Jane Wei

(57) ABSTRACT

A device can include a plurality of processing sources; a multiplexer (MUX) configured to assign read requests from the processing sources to predetermined time division multiplexer (TDM) command slots. A memory controller can generate nonvolatile memory (NVM) command and address data from read requests received from the MUX during the TDM command slots assigned to the read requests on a unidirectional command-address bus. The address data can include at least a bank address. The device can also receive read data on a unidirectional parallel data bus in synchronism with rising and falling edges of a received data clock. The read data can be received in TDM read slots having a predetermined order. A demultiplexer can provide the read data of each TDM read slot to one of the processing sources based on the TDM read slot position in the predetermined order. Related methods and systems are also disclosed.

20 Claims, 14 Drawing Sheets

(56) References Cited

U.S. PATENT DOCUMENTS

| | | | |
|---|---|---|---|
| 2007/0136536 A1* | 6/2007 | Byun | G11C 8/16 |
| | | | 711/149 |
| 2008/0225603 A1* | 9/2008 | Hein | G11C 7/1051 |
| | | | 365/189.05 |
| 2011/0164460 A1 | 7/2011 | Kajigaya et al. | |
| 2012/0117317 A1 | 5/2012 | Sheffler et al. | |
| 2017/0069364 A1* | 3/2017 | Shin | G11C 11/4076 |
| 2018/0004410 A1* | 1/2018 | Madraswala | G06F 3/061 |
| 2018/0375662 A1* | 12/2018 | Domke | G06F 3/065 |
| 2019/0098747 A1* | 3/2019 | Ho | H05K 1/0218 |
| 2019/0319730 A1* | 10/2019 | Webb | H04J 3/16 |

OTHER PUBLICATIONS

International Search Report for International Application No. PCT/US2020/044792 dated Nov. 24, 2020; 2 pages.
Written Opinion of the International Searching Authority for International Application No. PCT/US2020/044792 dated Nov. 24, 2020; 7 pages.

* cited by examiner

| TDM SLOT | ASSIGNED MASTER (Core, Thread, Process, etc.) |
|---|---|
| 0 | CORE0 |
| 1 | CORE1 |
| 2 | CORE2 |
| 3 | CORE3 |
| 4 | CORE0 |
| 5 | CORE1 |
| 6 | Not Used |
| ⋮ | |
| n | Not Used |

| CORE | ASSIGNED NVM ADDRESS(ES) |
|---|---|
| 0 | 0000 0000h to 001F FFFFh (BANK0) |
| 1 | 0020 0000h to 003F FFFFh (BANK0) |
| 2 | 0040 0000h to 011F FFFFh (BANKS 1, 2, 3, 4) |
| 3 | 0120 0000h to 01FF FFFFh (BANKS 4-7) |

| | CYCLES |
|---|---|
| TDM IN - OUT DELAY | 16 |

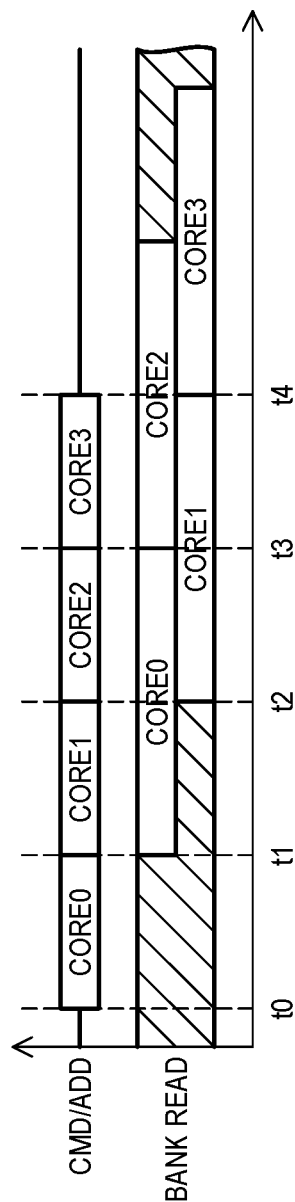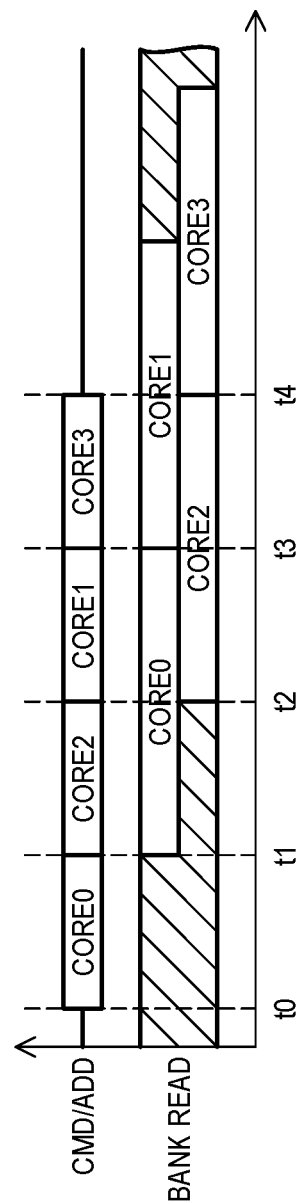

| Cores | Slots | Bandwidth | | | | Worst Latency | | | | TDM Schedule |
|---|---|---|---|---|---|---|---|---|---|---|
| | | Core0 | Core1 | Core2 | Core3 | Core0 | Core1 | Core2 | Core3 | |
| 4 | 4 | 25% | 25% | 25% | 25% | 4 slots | 4 slots | 4 slots | 4 slots | Core0 \| Core1 \| Core2 \| Core3    723-0 |
| 4 | 6 | 33% | 33% | 17% | 17% | 3 slots | 3 slots | 6 slots | 6 slots | Core0 \| Core1 \| Core2 \| Core0 \| Core1 \| Core3    732-1 |
| 4 | 8 | 50% | 25% | 13% | 13% | 2 slots | 4 slots | 8 slots | 8 slots | Core0 \| Core1 \| Core0 \| Core2 \| Core0 \| Core1 \| Core0 \| Core3    732-2 |

FIG. 7

|  | Units | Value | | | |
|---|---|---|---|---|---|
| Interface | MHz | 800 | 800 | 1600 | 1600 |
|  | MT/s | 1600 | 1600 | 3200 | 3200 |
|  | ns | 1.25 | 1.25 | 0.625 | 0.625 |
| Read burst (1x16) | b | 256 | 128 | 256 | 128 |
|  | ns | 10 | 5 | 5 | 2.5 |
| Bank Sharing 2 cores |  | yes | yes | yes | no |
| Bank Sharing 4 cores |  | yes | no | no | no |
| Address Transfer | cy | 4 | 4 | 4 | 4 |
| Delay to Issue | cy | 2 | 2 | 4 | 8 |
| Array read | cy | 8 | 8 | 16 | 16 |
| Delay to data out | cy | 6 | 6 | 12 | 12 |
| Data out | cy | 8 | 4 | 8 | 4 |
| Total Transaction Latency | cy | 28 | 24 | 44 | 44 |
|  | ns | 35 | 30 | 27.5 | 27.5 |
| Worst case latency core w/ 50% TDM slots | ns | 55 | 40 | 37.5 | 32.5 |
| Worst case latency core w/ 33% TDM slots | ns | 65 | 45 | 42.5 | 35 |
| Worst case latency core w/ 25% TDM slots | ns | 75 | 50 | 47.5 | 37.5 |
| Worst case latency core w/ 12.5% TDM slots | ns | 115 | 70 | 67.5 | 47.5 |
| Average latency core w/ 50% TDM slots | ns | 45 | 35 | 32.5 | 30 |
| Average latency core w/ 33% TDM slots | ns | 50 | 37.5 | 35 | 31.25 |
| Average latency core w/ 25% TDM slots | ns | 55 | 40 | 37.5 | 32.5 |
| Average latency core w/ 12.5% TDM slots | ns | 75 | 50 | 47.5 | 37.5 |

FIG. 9

MEMORY CONTROLLER FOR NON-INTERFERING ACCESSES TO NONVOLATILE MEMORY BY DIFFERENT MASTERS, AND RELATED SYSTEMS AND METHODS

RELATED APPLICATIONS

This application claims the benefit of U.S. provisional patent application having Ser. No. 62/883,019, filed on Aug. 5, 2019, the contents of which are incorporated by reference herein.

TECHNICAL FIELD

The present disclosure relates generally to systems having multiple master devices and processes that access a same nonvolatile memory device.

BACKGROUND

Many control systems can include multiple processes (e.g., cores) controlling different subsystems. In many cases it is desirable for such processes to access a nonvolatile memory (NVM) device. A NVM device can ensure critical data is stored in the absence of power. For example, automobiles can include a controller having multiple processor cores, each core dedicated to a particular system or function. The processor cores can read data from and store data in a corresponding NVM device.

A drawback to conventional systems can be latency. If multiple processes compete for a same NVM device, some sort of arbitration process must be employed to prioritize accesses. Absent such arbitration, conflicts between different processes can arise, leading to unpredictable latency in accesses, or poor performance as a process interrupts other processes with a priority access request.

One way to address such variable latency in accesses to a NVM device can be to increase the number of NVM devices, dedicating some NVM devices to particular processes. Such an approach can ensure latency for some processes but can greatly increase the cost and size of a resulting system.

BRIEF DESCRIPTION OF THE DRAWINGS

FIGS. 6A and 6B are timing diagrams showing NVM accesses by a processor device according to embodiments.

FIG. 7 is a table showing various configurations of a processor device according to embodiments.

FIG. 9 is a table showing data access performance of processor devices according to embodiments.

DETAILED DESCRIPTION

Figure 1A:
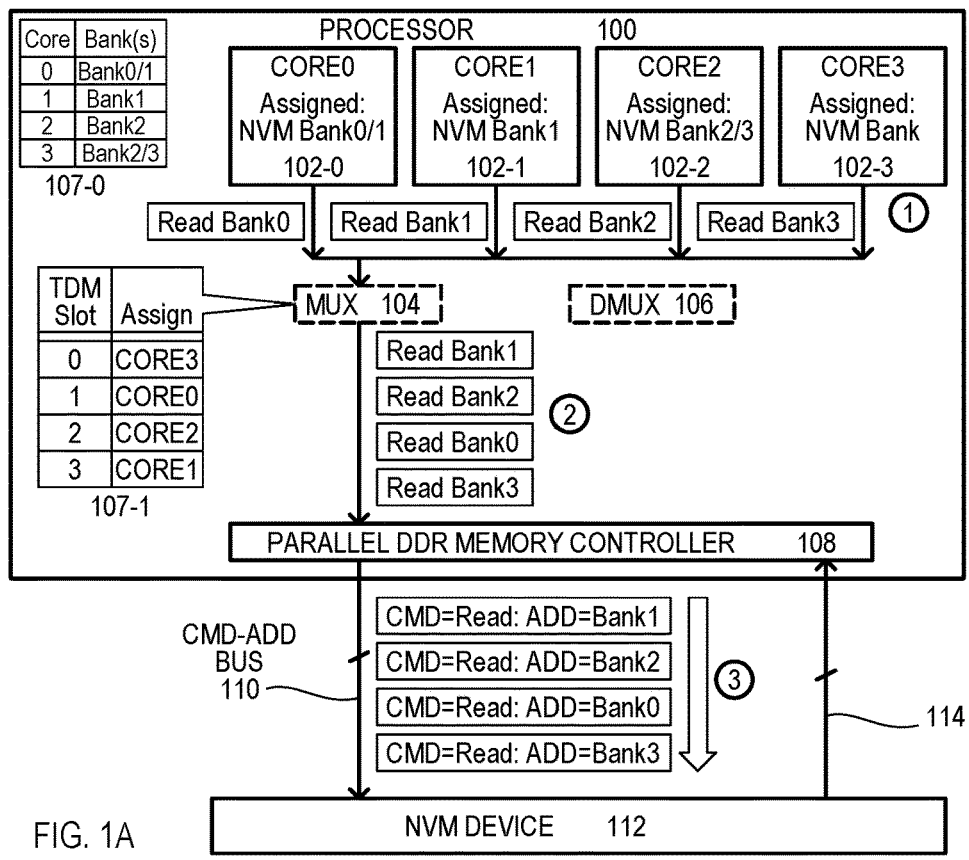
FIGS. 1A and 1B are diagrams showing time division multiplex (TDM) accesses by a processor device to a nonvolatile memory (NVM) device, according to embodiments.

According to embodiments a controller device can include a number of processing circuits (e.g., cores). Each processing circuit can issue requests to access banks of a NVM device. Such access requests can be assigned slots in a time division multiplex (TDM) arrangement. A memory controller circuit can then issue the requests in the TDM order as command-address values over a command-address bus to the NVM device. In the event of read request, subsequently read data can be received in a unidirectional double data rate (DDR) data bus, also in TDM fashion. Read data received in particular TDM slot can correspond to the requesting process.

In some embodiments, each process can be assigned at least one NVM bank of the NVM device, and the process will only access its assigned NVM bank(s).

In some embodiments, each process can be assigned to no more than two NVM banks of the NVM device.

In some embodiments, if a process accesses an NVM bank in one TDM slot, a different process may not access the same NVM bank in the immediately following TDM slot.

In some embodiments, the controller device can access the NVM device over a parallel memory interface. A parallel memory interface can be compatible with the LPDDR4 standard promulgated by JEDEC.

In the various embodiments below, like items are referred to by the same reference characters, but with the leading digit(s) corresponding to the figure number.

Figure 1B:
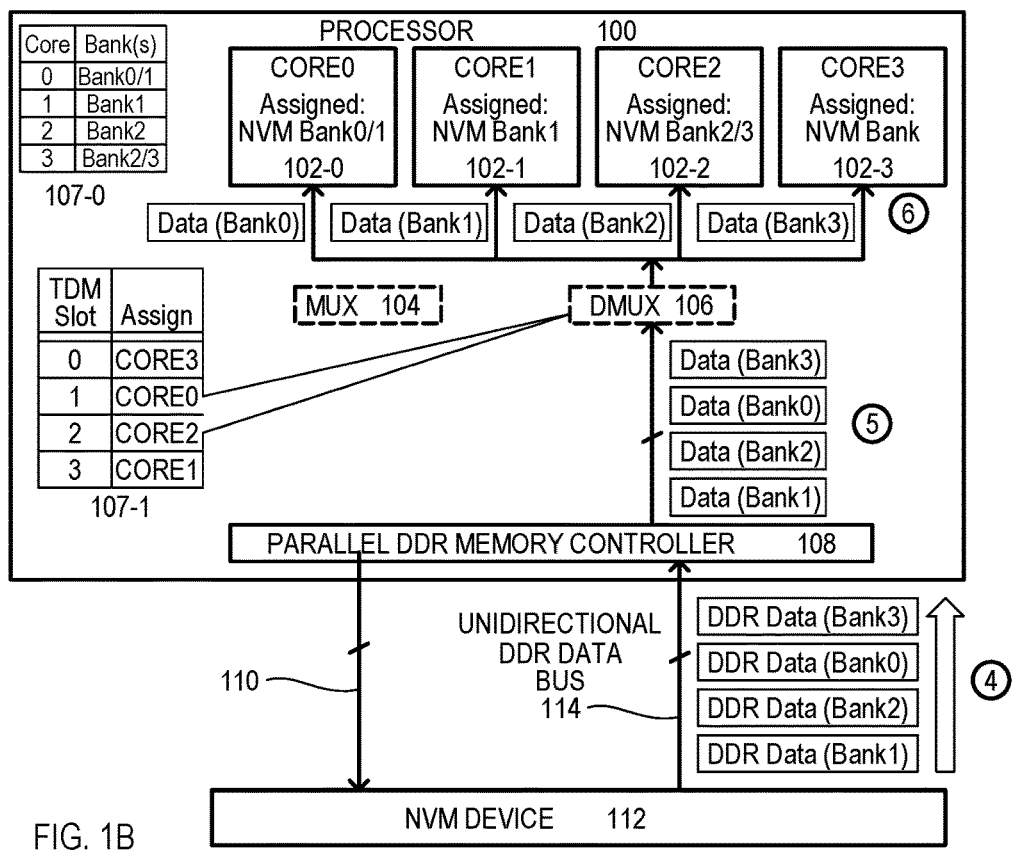

FIGS. 1A and 1B are block diagrams showing a processor device 100 and operations according to embodiments. A processor device 100 can include a number of processing cores 102-0 to -3, a multiplexer (MUX) 104, a demultiplexer (DMUX) 106, core assignment data 107-0, TDM assignment data 107-1, and a parallel DDR memory controller 108. Cores (102-0 to -3) can include processing circuits that can be dedicated to separate processing tasks. According to embodiments, cores (102-0 to -3) can be assigned to one or more NVM banks (not shown) of a corresponding NVM device 112. Accordingly, once a core (102-0 to -3) is assigned to an NVM bank, it will not request accesses to a non-assigned bank. While FIGS. 1A/B show four cores, a processor device can include a greater or fewer number of cores.

A MUX 104 can receive access requests from cores (102-0 to -3) and assign them to predetermined TDM command slots in a TDM arrangement. According to embodiments, a core (102-0 to -3) can be assigned to more than one TDM command slot, but multiple cores (102-0 to -3) may not be assigned to a same TDM command slot. A TDM command arrangement can cycle through in a predetermined order. In some embodiments, if an access request is received at MUX 104 before the correct TDM command slot, the MUX 104 can wait unit the appropriate time slot to service the request. Further, if no access request for a given TDM command slot, MUX 104 can issue no request.

A MUX 104 can take any suitable form. A MUX 104 can include dedicated circuits, such a data buffer that receives access requests and stores them at locations corresponding to a TDM command slot, then outputs the access request at the appropriate time. However, a MUX 104 can also be coordinated processes running on each core (102-0 to -3), with each core (102-0 to -3) limiting access requests to its dedicated TDM slot. These are but two examples that should not be construed as limiting. One skilled in the art could arrive at various other MUX configurations.

A DMUX 106 can take any suitable form. As in the case of MUX 104, a DMUX 106 can include dedicated circuits, such as a data buffer that receives read data stores them at locations corresponding to a TDM slot. Such read data can then be read by a corresponding core (102-0 to -3). Alternatively, cores (102-0 to -3) can coordinate accesses to read data, reading data only in their assigned TDM read slot.

Core assignment data 107-0 can record which NVM banks are assigned to which cores (102-0 to -3). Core assignment data 107-0 can be stored in memory circuits of the processor device 100, including configuration registers. In the particular embodiment shown, core0 is assigned to both NVM banks 0 and 1, core1 is assigned to NVM bank 1, core2 is assigned NVM bank 2, and core3 is assigned NVM banks 2 and 3. TDM assignment data 107-1 can record which cores have which TDM command slot. TDM assignment data 107-1 can be stored in memory circuits of the processor device 100, including configuration registers. In the particular embodiment shown, core3 is given TDM slot 0, core0 is given TDM slot 1, core 2 is given TDM slot 2, and core1 is given TDM slot 3. While FIGS. 1A/B show four TDM slots, as will be shown later, other embodiments can include different numbers of TDM slots.

Memory controller circuit 108 can include controller circuits for accessing banks of a NVM device 112. According to embodiments, memory controller circuit 108 can issue command and address data as a sequence of parallel bits over a command-address bus 110. Read data can be received over a unidirectional read data bus 114 in sets of parallel bits. Such read data can be received in groups (e.g., bursts) in synchronism with the falling and rising edges of a data clock.

FIG. 1A shows one example of the start of a read operation according to an embodiment.

As shown at circle 1, cores (102-0 to -3) can issue read requests to various banks. In the example of FIG. 1A, core 102-0 issues a read request to NVM bank0, core 102-1 issues a read request to NVM bank1, core 102-2 issues a read request to NVM bank2, and core 102-3 issues a read request to NVM bank3. Such requests are proper as they comply with core assignment data 107-0. The various read requests can occur at various times and various orders.

As shown at circle 2, MUX 104 can order requests issued by cores (102-0 to -3) based on TDM assignment data 107-1. Regardless of when the read requests were issued by the cores (102-0 to -3), the read requests are ordered according to the TDM assignment data 107-1. Thus, the read requests can be issued to the memory controller circuit 108 in the order: a read to bank3 (issued by core2) (i.e., TDM slot 0); a read to bank0 (issued by core0) (i.e., TDM slot 1); a read to bank2 (issued by core2) (i.e., TDM slot 2); and a read to bank1 (issued by core1) (i.e., TDM slot 3).

As shown at circle 3, memory controller circuits 108 can generate the appropriate command and address data on command-address bus 110 in the assigned TDM slot.

FIG. 1B shows the end of the read operation shown in FIG. 1A according to an embodiment.

As shown at circle 4, in response to the command and address data issued by processor device 100, NVM device 112 can output the resulting read data in the order the command and address data were received. Such read data can be output on unidirectional data bus 114, in DDR format.

As shown at circle 5, memory controller circuits 108 can receive the read data from the NVM device and provide it to DMUX 106. Each set of read data can be received in a TDM read slot, having an order set by TDM assignment data 107-1.

As shown in circle 6, DMUX 106 can order read data for access by cores (102-0 to -3) based on when such read data is received (i.e., the read data's TDM read slot).

In this way, different cores of a same processing device can be ensured access to different banks of a same memory device via TDM read accesses and resulting read data.

Figure 2:
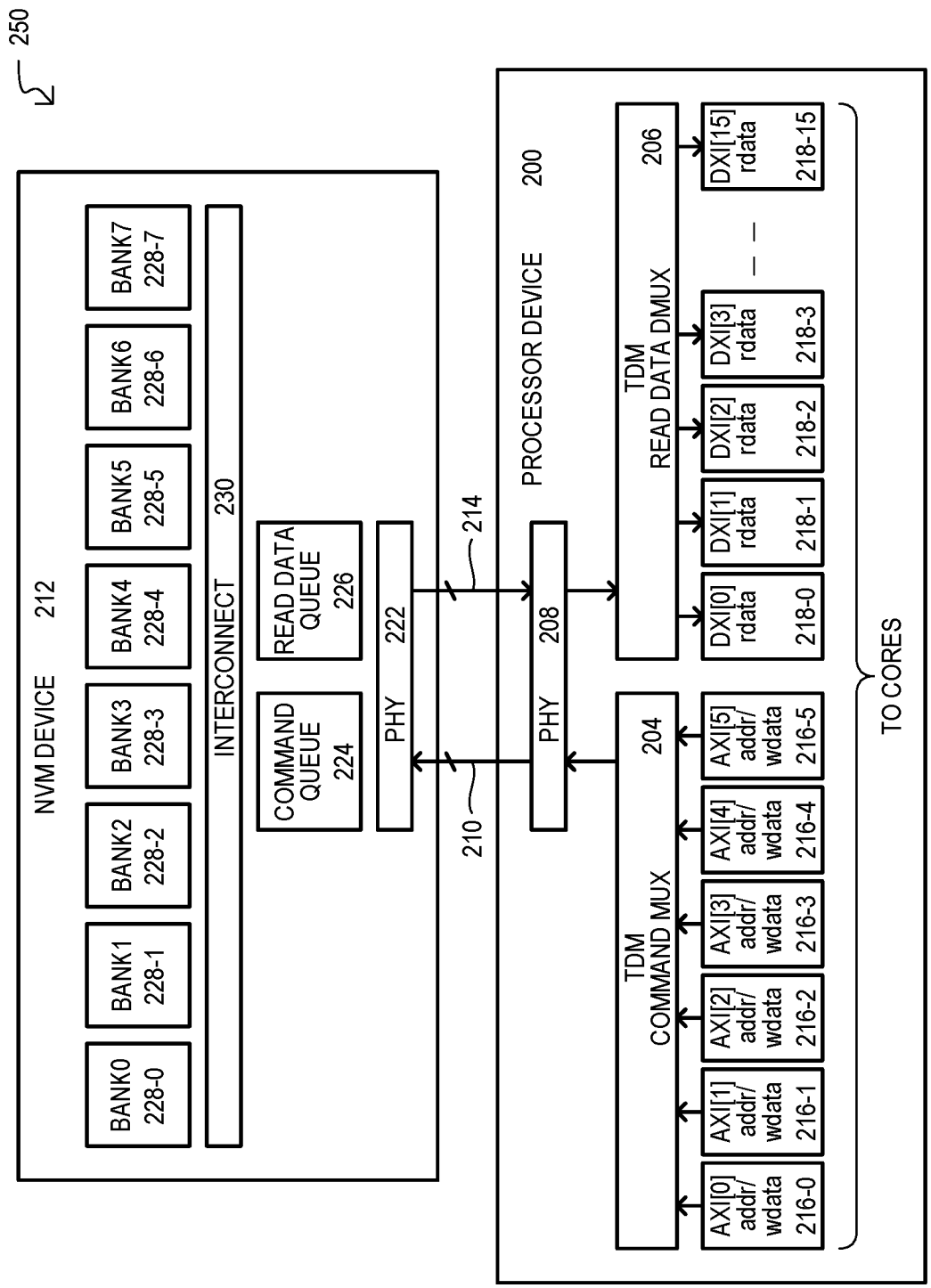
FIG. 2 is a block diagram of a system according to an embodiment.

FIG. 2 is a block diagram of a system 250 according to an embodiment. A system 250 can include a processor device 200 and a NVM device 212. A processor device 200 can receive command/address values (and optionally, write data values) from multiple processes (e.g., cores). In the embodiment shown, command/address data can be received in sets of six parallel bits 216-0 to -5 (AX[0] to AX[5]). Command/address values (AX[0] to AX[5]) can be received from, or generated by requests from, different processes. Further, processes can be assigned to one or more particular banks. Access to banks can be dictated by higher order address bits received in command/address values (AX[0] to AX[5]).

A TDM command MUX 204 can apply command address values (AX[0] to AX[5]) to a physical interface (PHY) 208 in a predetermined TDM command order, where TDM slots are dedicated to particular processes (e.g., cores). Examples of various possible TDM assignments are be described in further detail herein.

PHY 208 can convert command/address values (AX[0] to AX[5]) into corresponding signals driven on command-address bus 210 (i.e., six command address lines). Such signaling can be compatible with an existing parallel data interface standard, and in some embodiments, can be compatible with the LPDDR4 standard. Command/address values (AX[0] to AX[5]) can constitute commands compatible with an existing standard. However, in some embodiments, command/address values (AX[0] to AX[5]) may be custom commands. That is, commands can be received with signaling according to a standard, but the bit values transmitted are not part of an existing standard.

A NVM device 212 can include a number of banks 228-0 to -7, interconnect 230, command queue 224, read data queue 226, and memory PHY 222. Banks (228-0 to -7) can each include a number of NVM cells. NVM cells can be any suitable type of nonvolatile memory cell that stores data in a nonvolatile fashion. In some embodiments, NVM memory cells can be "flash" type memory cells having a NOR type architecture. Within each bank (228-0 to -7) NVM cells can be arranged into one or more arrays, and accessible by row and column addresses. Banks (228-0 to -7) can be separately addressable. That is, a physical addressing of NVM device 212 can have a separate bank address for each bank (228-0 to -7). All banks (228-0 to -7) can be connected to interconnect 230.

Interconnect 230 can enable access to banks (228-0 to -7), and can include any suitable circuits such as decoders, program circuits, and read circuits (e.g., sense amplifiers) as but a few examples. In the embodiment shown, interconnect 230 can receive command/address values from command queue 224, and in response, access NVM cells in an addressed bank. Interconnect 230 can also receive read data from banks (228-0 to -7) and provide the read data to read data queue 226.

Command queue 224 can receive and store commands/address values provided to interconnect 230. In some embodiments, command queue 224 can provide command/address values on a first-in-first-out basis. However, it is understood command/address data can be received in a TDM order dictated by processor device 200. Read data queue 226 can receive read data from interconnect 230 and provide it to memory PHY 222. In some embodiments, read data queue 226 can provide read data in the same order as received command/address values. Thus, read data can follow the same TDM order dictated by processor device 200.

Memory PHY 222 can be a PHY corresponding to PHY 208 of processor device 200. Accordingly, memory PHY 222 can receive command-address values transmitted on command-address bus 210, and output read data on DDR data bus 214. As in the case of processor PHY 208, memory PHY 222 can generate signals compatible with an existing parallel data interface standard, such as the LPDDR4 standard as but one example.

Referring back to processor device 200, read data from NVM device 212 can be received by PHY 208. Resulting data values can be provided to TDM read data DMUX 206. TDM data DMUX 206 can provide read data values (DX[0] to DX[15]) to corresponding processes in the same order as the TDM commands.

Figures 3A, 3B, 4A, 4B:
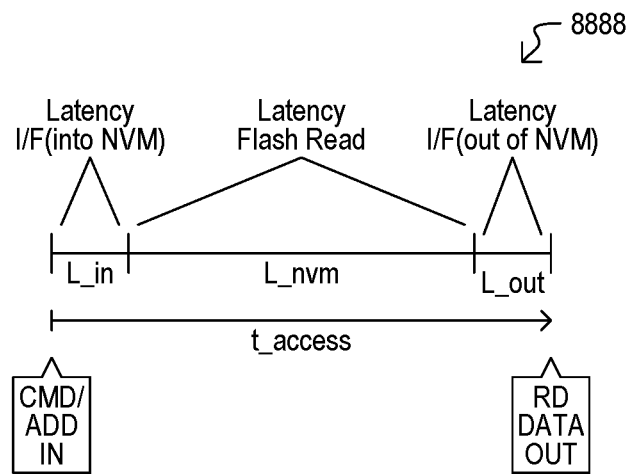
FIGS. 3A and 3B are tables showing TDM slot assignments and bank assignments for a processor device according to embodiments.
FIGS. 4A and 4B are diagrams showing data access times according to embodiments.

FIG. 3A is a table showing TDM command slot assignments according to an embodiment. FIG. 3A shows how any number of TDM slots can be created according to a type of access desired. For example, one master (e.g., CORE0 gets slots 0 and 4) can be assigned to more TDM command slots than another master (e.g., CORE0 gets slots 0 and 4, while CORE2 only gets slot 2). Such an arrangement gives one core a higher bandwidth than the other. FIG. 3A shows an example where six TDM command slots are used, but the number of command slots can be increased or decreased as desired. While TDM command assignments can be relatively fixed (e.g., established by register on power-on or reset), in other embodiments a processor device can include an active TDM control which can assign TDM command slots dynamically.

TDM command slots can be assigned to any suitable process, and thus can be assigned according to a core or a thread, as but two examples.

FIG. 3B is a table showing a bank assignments according to an embodiment. Each process (in this case CORE) can be assigned to particular address range in a same NVM device, where address ranges include separately accessible banks. In this way, accesses can be, or can be scheduled to be, non-interfering. This can ensure a process can be served within some maximum latency. In the example shown, CORE0 and CORE1 can access different regions of a same bank (BANK0). CORE2 can have sole access to three banks (BANK1, 2, 3) and access one part of BANK4. CORE3 can access another part of BANK4 and have sole access to BANK5 to 7. In some embodiments, accesses to a same bank cannot occur on consecutive TDM command slots.

In this way, processes can be assigned to different addresses spaces of an NVM device, thus ensuring all accesses by the cores are noninterfering and can have a fixed, maximum latency.

FIG. 4A is a table showing a delay value that can be provided to, or determined by a processor device. A delay value can be a TDM IN-TDM OUT value, which can indicate how many cycles between application of a command/address values (corresponding to a read access) and resulting read data. Such a value can enable a processor device to establish appropriate TDM read slots for corresponding TDM command slots.

FIG. 4B shows a latency for read operations according to embodiments. A processor device can issue a read command (CMD/ADD IN). After a latency L_in, the command and address value can reach the NVM device. The NVM device has its own access latency L_nvm, corresponding to processing command and address data, accessing a bank, and driving the read data on an output bus. After a latency L_out, the read data can be received by the processor device and available for a requesting process. The overall time can be an access time t_access. As will be shown in more detail herein, command/address values can be issued at a faster rate than an access time (t_access), as accesses to different banks can overlap in time.

It is understood that in addition to t_access, an overall latency can include when a TDM time slot for the core becomes available. Because a TDM command schedule repeats, if the core misses its slot in a current TDM round, it will be serviced in the next TDM round. That is, the repeating TDM order ensures a core will be serviced with some latency.

Figure 5A:
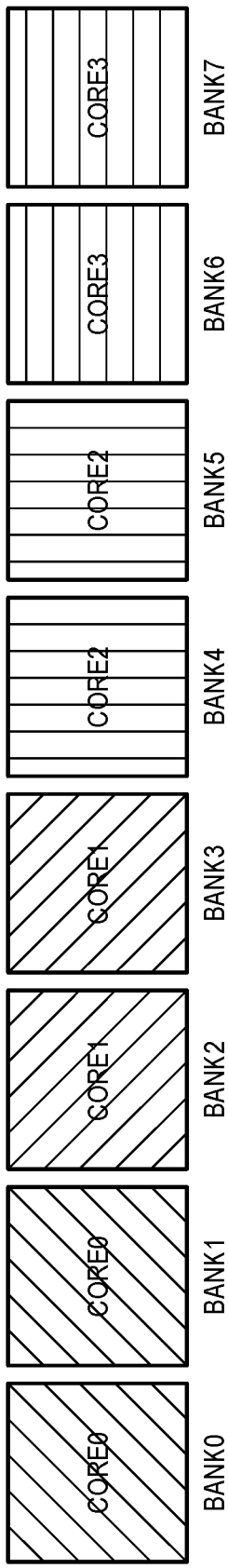
FIGS. 5A to 5C are diagram showing examples of bank assignments to processing cores of a processor device according to embodiments.
Figure 5B:
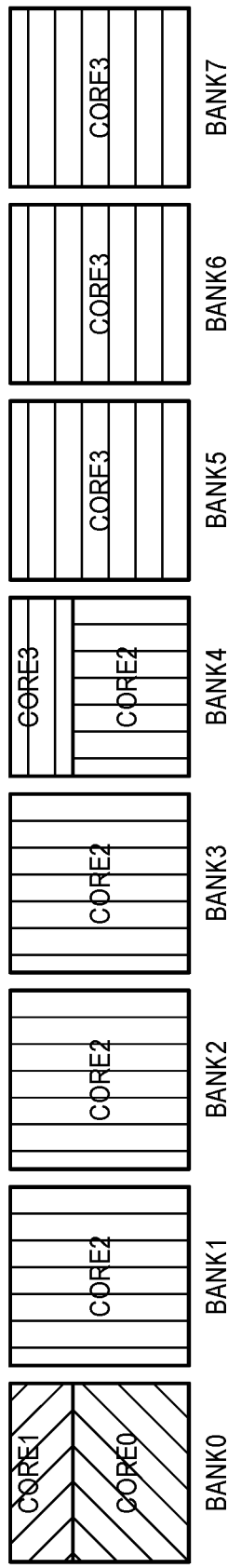
Figure 5C:
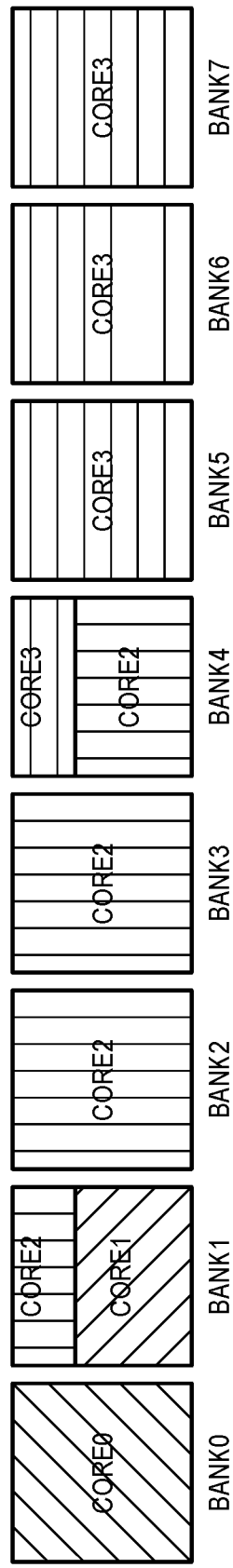

FIGS. 5A to 5C are diagrams showing various bank assignments according to embodiments. FIGS. 5A to 5C assume a system is assigning four cores (CORE0 to CORE3) to eight banks (BANK0 to BANK7) of an NVM device.

FIG. 5A shows an arrangement in which each core is assigned whole banks. That is CORE0 is assigned BANK0/1, CORE1 is assigned BANK2/3, CORE2 is assigned BANK4/5 and CORE3 is assigned BANK6/7. In such an arrangement, no access has the potential to be interfering, thus TDM command accesses can have no restrictions on access order.

FIG. 5B shows an arrangement like that shown in FIG. 3B. CORE0 and CORE1 are assigned different portions of BANK0. CORE2 is assigned all of BANK1, BANK2 and BANK3. In addition, CORE2 and CORE3 are assigned different portions of BANK4. CORE3 is also assigned all of BANK5, BANK6 and BANK7. In such an arrangement, conflicts can be avoided by alternating between the core pairs sharing a bank in the TDM command order.

FIG. 5C shows an arrangement in which a core (CORE2) is assigned to more than two banks. In particular, CORE2 is assigned to a portion of BANK1, all of BANK2 and BANK3, and a portion of BANK4. In such an arrangement, a processor device can employ dynamic TDM scheduling. For example, an access by CORE2 could not immediately follow (occur in a next TDM slot) an access by CORE1, unless it was not to BANK1, and vice versa. Similarly, accesses to BANK4 by CORES 2 and 3 could not immediately follow one another. It is noted that such dynamic scheduling may result in variable latency times, as core positions in TDM order are not fixed.

FIG. 6A is timing diagram showing a scheduling of TDM accesses to an NVM device according to an embodiment. FIG. 6A shows accesses for an arrangement like of FIG. 5A, where each core is assigned whole (and different) banks. It is assumed that different banks of the NVM device can be accessed at the same time (but multiple cores may not access a same bank at the same time).

FIG. 6A shows command and address inputs (CMD/ADD) output from a controller device (to an NVM device), as well as access operations to addressed banks (BANK READ). The BANK READs are identified by a corresponding core but are understood to be directed to different banks.

At time t0, an access request can be issued for CORE0.

At about time t1, the access request for CORE0 can start to be processed by the NVM device, as shown by CORE0 in BANK READ. At about the same time, a next access request can be issued for CORE1.

At about time t2, the bank access for CORE0 can continue, but in addition, the bank access for CORE1 can begin. Because such accesses are to different banks, they can occur at the same time. This is shown by bank accesses for CORE0 and CORE1 overlapping between times t2 and t3. Also at about time t2, the access request can be issued for CORE2.

At about time t3, the bank access for CORE0 can end. The bank access for CORE1 can continue, and the bank access for CORE2 can begin. Bank accesses for CORE1 and CORE2 can occur at the same time between times t3 and t4. Also at about time t3, the access can be issued for CORE3.

Core accesses can continue in an overlapped fashion with respect to time until all bank accesses are complete.

Referring still to FIG. 6A, it is noted that the time for command address transactions (CMD/ADD) can occur at a faster rate than bank access times. This can allow for high data throughput operations. Further, as noted herein, due to the repeating nature of the TDM order, all access requests can be serviced with a fixed maximum latency.

FIG. 6B is timing diagram showing a scheduling of TDM accesses to an NVM device according to another embodiment. FIG. 6B shows accesses for an arrangement like of FIG. 5B, where CORE0 and CORE1 can share a bank, and CORE2 and CORE3 share a bank. The scheduling FIG. 6B shows a restriction where an accesses by cores that share a bank cannot occur in adjacent TDM slots. This is ensured by the TDM order which shows CORE2 (and not CORE1) following CORE0, and CORE1 (and not CORE3) following CORE 2.

The scheduling of FIG. 6B has the same high throughput operations and fixed maximum latency as in FIG. 6A, but with the added TDM order restriction (alternating between pairs of cores that share a same NVM bank).

As noted herein, according to embodiments, TDM command slots can be varied to arrive at different bandwidth allocations for processes. That is, bandwidth can be increased for some processes (e.g., cores) and decreased for others to achieve a desired performance. In such approaches, because TDM scheduling in employed, every process can be guaranteed access to the NVM device with some capped or fixed latency.

In FIG. 7, "Cores" shows a number of processes, "Slots" shows the number of TDM slots, "Bandwidth" shows overall memory bandwidth for each core (rounded off), "Worst Latency" shows a worst case latency for each core (in TDM slots), "TDM Schedule" shows the TDM slot order by core (going left to right). FIG. 7 shows three examples 723-0 to -2. Such examples should not be construed as limiting.

The first example 723-0 shows an arrangement like that of FIG. 6A. Cores are given even access time in the TDM schedule. The TDM schedule includes four TDM slots. A worst latency can be the same for each core.

The second example 723-1 shows an arrangement in which Core0 and Core1 are given more access (twice that) of Core2 and Core3. The TDM schedule includes six TDM slots. As shown, those cores with greater bandwidth have a smaller worst case latency as their position in the TDM sequence will appear more frequently.

The third example 723-2 shows an arrangement in which Core0 is given four times the bandwidth of Core2 and Core3, and twice the bandwidth of Core1. The TDM schedule includes eight TDM slots. Again, higher bandwidth cores have a better worst case latency.

In this way, TDM access can be assigned to increase bandwidth for some processes over that of others.

FIGS. 8A to 8D show various NVM access by a processor device using TDM command slots as described herein. In the various example shown, it is assumed that read accesses to the NVM device can occur in response to command/address values transmitted over four clocks of a command clock (not shown). Each of FIGS. 8A to 8D shows command/address values (CMD/ADD), resulting bank accesses in the NVM device (BANK ACCESS), and resulting data output from the NVM device (DATA OUT). DATA OUT values can be DDR outputs, providing a data in parallel (e.g., ×16) twice every clock cycle. Further, accesses can occur at a faster rate than a bank access within the NVM device.

Figure 8A:
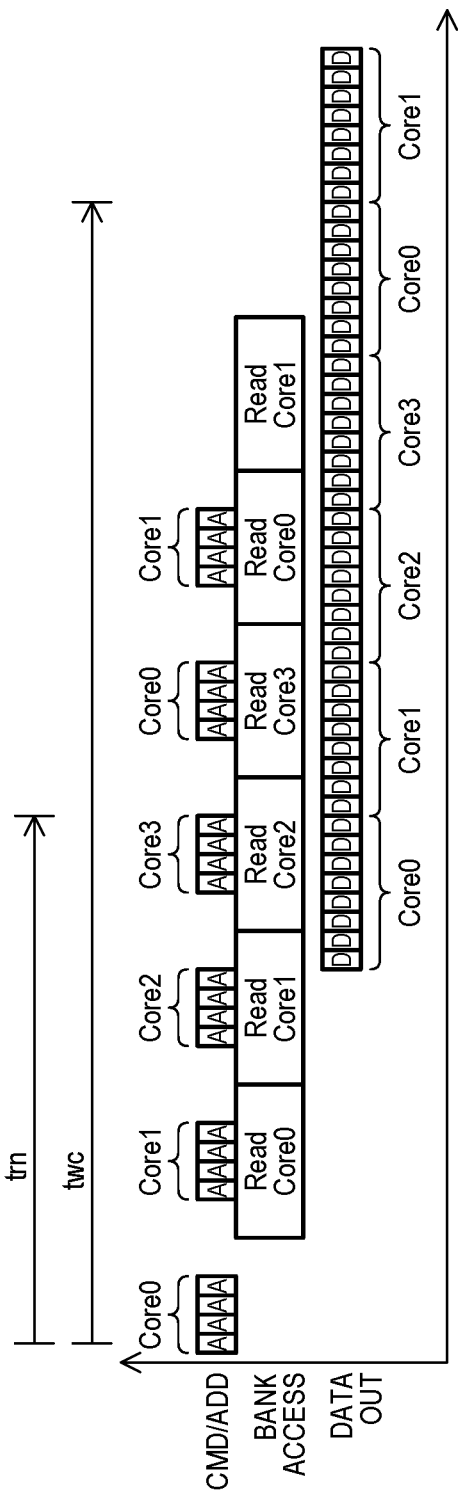
FIGS. 8A to 8D are diagrams showing processor accesses according to various embodiments.

FIG. 8A shows an arrangement in which access requests are issued at the same rate as a bank access speed. CMD/ADD values can be issued over four clocks (each value shown as "A"). A resulting bank access can take about eight clocks. Because CMD/ADD values are not received at a faster rate than bank access values, bank accesses do not have to overlap in time. Data can be output from each bank in bursts of eight (each burst shown as D). It is understood that a burst can be multiple bits (e.g., ×16). In the arrangement of FIG. 8A, a time between the issuing of commands and the output of all data (transaction latency, trn) can be 28 clock cycles. A worst case latency (twc) can be 60 clock cycles. Thus, an average latency can be about 44 clock cycles. In the arrangement of FIG. 8A cores can access any bank and share any bank. In a particular example, an interface clock speed (a speed at which command sequences are received) can be 800 MHz, while an internal speed of the NVM device can be 100 MHz (i.e., providing data burst every 10 ns).

Figure 8B:
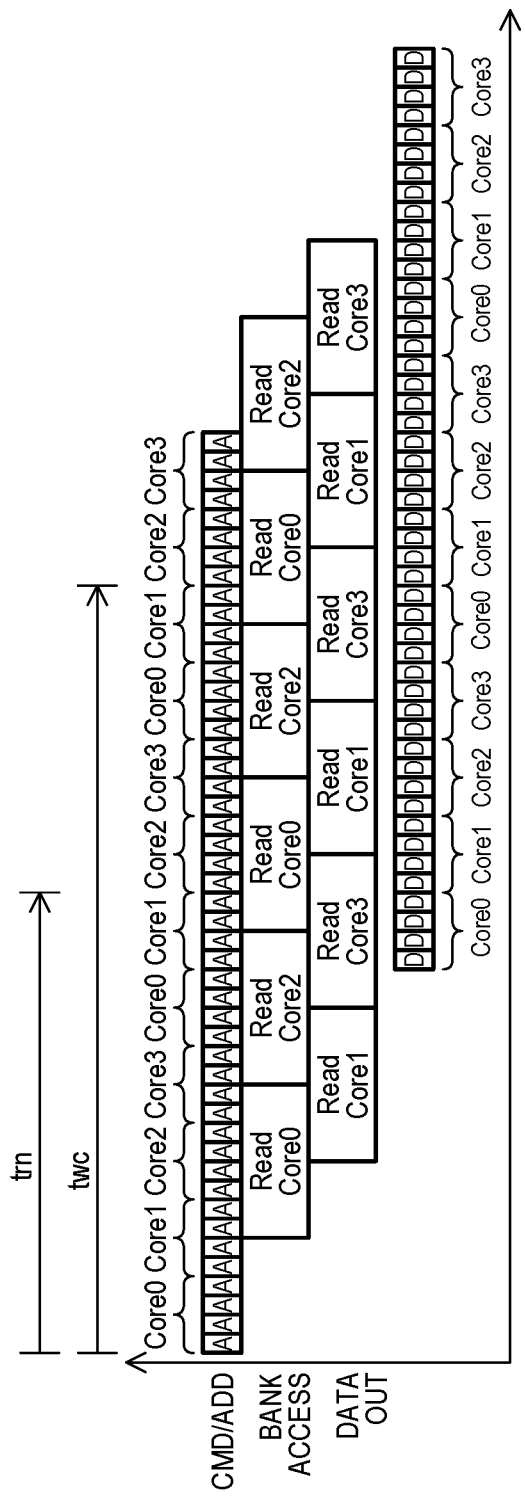

FIG. 8B shows an arrangement in which access requests can be issued at a faster rate than a bank access speed. CMD/ADD values can be issued over consecutive four clock time periods. Consequently, bank accesses overlap in time. In FIG. 8B, data can be output in burst of eight (four cycles at a DDR rate). In such an arrangement, a transaction latency (trn) can be 24 clock cycles. A worst case latency (twc) can be 40 clock cycles. Thus, an average latency can be about 32 clock cycles. In the arrangement of FIG. 8B, subsequent accesses cannot be to a same bank. In a particular example, an interface clock speed can be 800 MHz, while an effective internal speed of the NVM device can be 200 MHz (i.e., providing data burst every 5 ns).

Figure 8C:
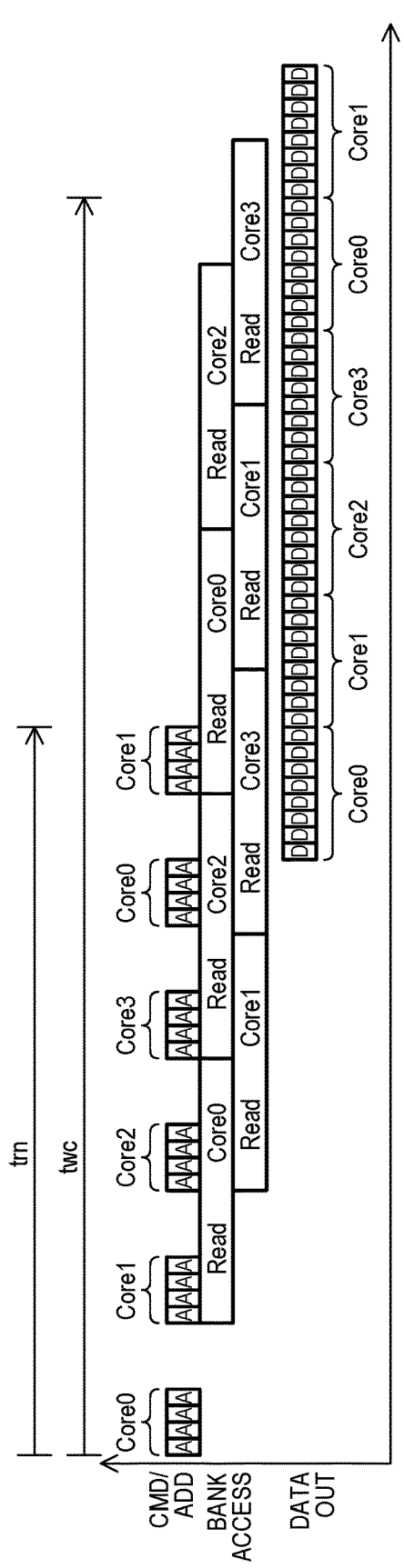
Figure 8D:
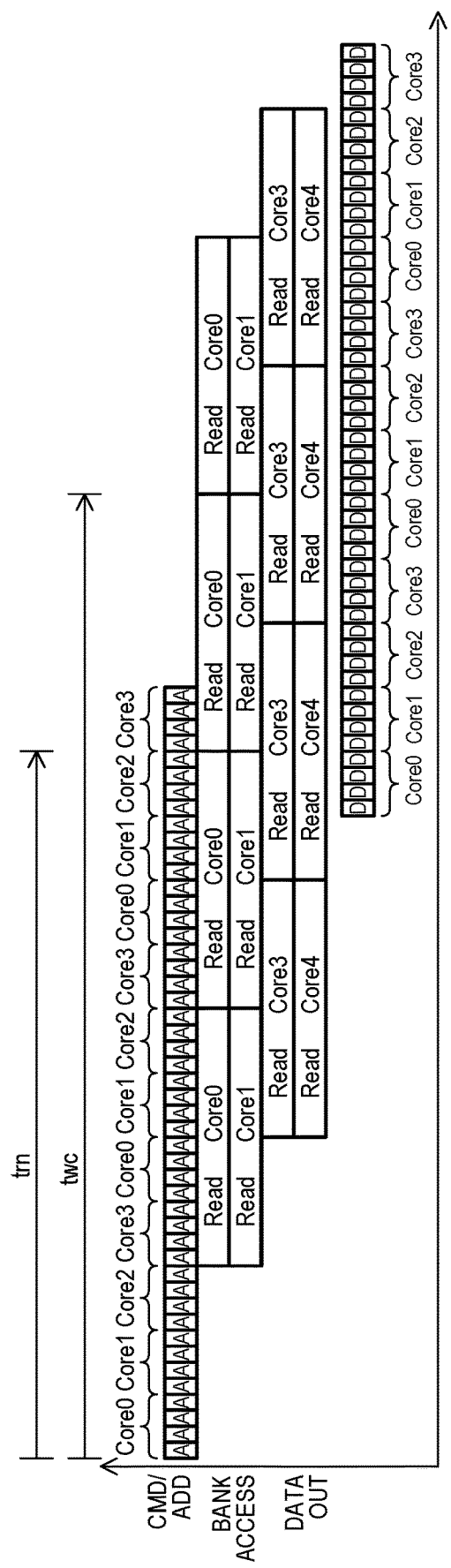

FIGS. 8C and 8D show arrangement in which CMD/ADD values can be input at faster rates with respect to a bank access time than the examples of FIGS. 8A and 8B.

FIG. 8C shows an arrangement in which access requests are issued at twice the speed of a bank access. CMD/ADD values can be issued over four clocks and a resulting bank access can take about sixteen clocks. Data can be output from each bank in bursts of eight. In the arrangement of FIG. 8C, a transaction latency (trn) can be 44 clock cycles. A worst case latency (twc) can be 80 clock cycles. Thus, an average latency can be about 60 clock cycles. In the arrangement of FIG. 8C, subsequent accesses cannot be to the same bank. In a particular example, an interface clock speed can be 1600 MHz, while an effective internal speed of the NVM device can be 200 MHz.

FIG. 8D shows an arrangement in which access requests can be issued at four times a bank access speed. CMD/ADD values can be issued over consecutive four clock time periods. Consequently, bank accesses overlap in time t0 different banks. In FIG. 8D, data can be output in burst of eight. In such an arrangement, a transaction latency (trn) can be 44 clock cycles. A worst case latency (twc) can be 60 clock cycles. Thus, an average latency can be about 52 clock cycles. In the arrangement of FIG. 8D, there can be no bank sharing between cores. In a particular example, an interface clock speed can be 1600 MHz, while an effective internal speed of the NVM device can be 200 MHz.

FIG. 9 is table showing performance parameters for processor devices according to various embodiments. FIG. 9 shows values for various examples of an Interface for speeds of 800 MHz and 1600 MHz (also shown in MT/s, and clock cycle duration (in ns)). A Read burst (DATA OUT) can be in parallel ×16 and in DDR form. A Read burst can be in burst of sixteen (256 b) or bursts of eight (128b). Bank sharing possibilities for the examples are shown, including sharing of an NVM bank by two cores or by four cores. The various components of a total transaction latency are shown as: Address Transfer (time for command address data to be clocked into the device), Delay to Issue (time for command and address data to be processed by NVM device), Array read (time to access NVM array), Delay to data out (time t0 get data from array to NVM output circuits), and Data out (time t0 clock data out of the device).

FIG. 9 also shows worst case latency and average latency, for various bandwidth sharing by a core (i.e., 50% TDM slots, 33% TDM slots, 25% TDM slots, 12.5% TDM slots).

As shown, multiple cores can have a high throughput access to a same NVM device with short worst case latency, and small average latency with respect to systems in which cores must contend for access to an NVM memory.

Figure 10:
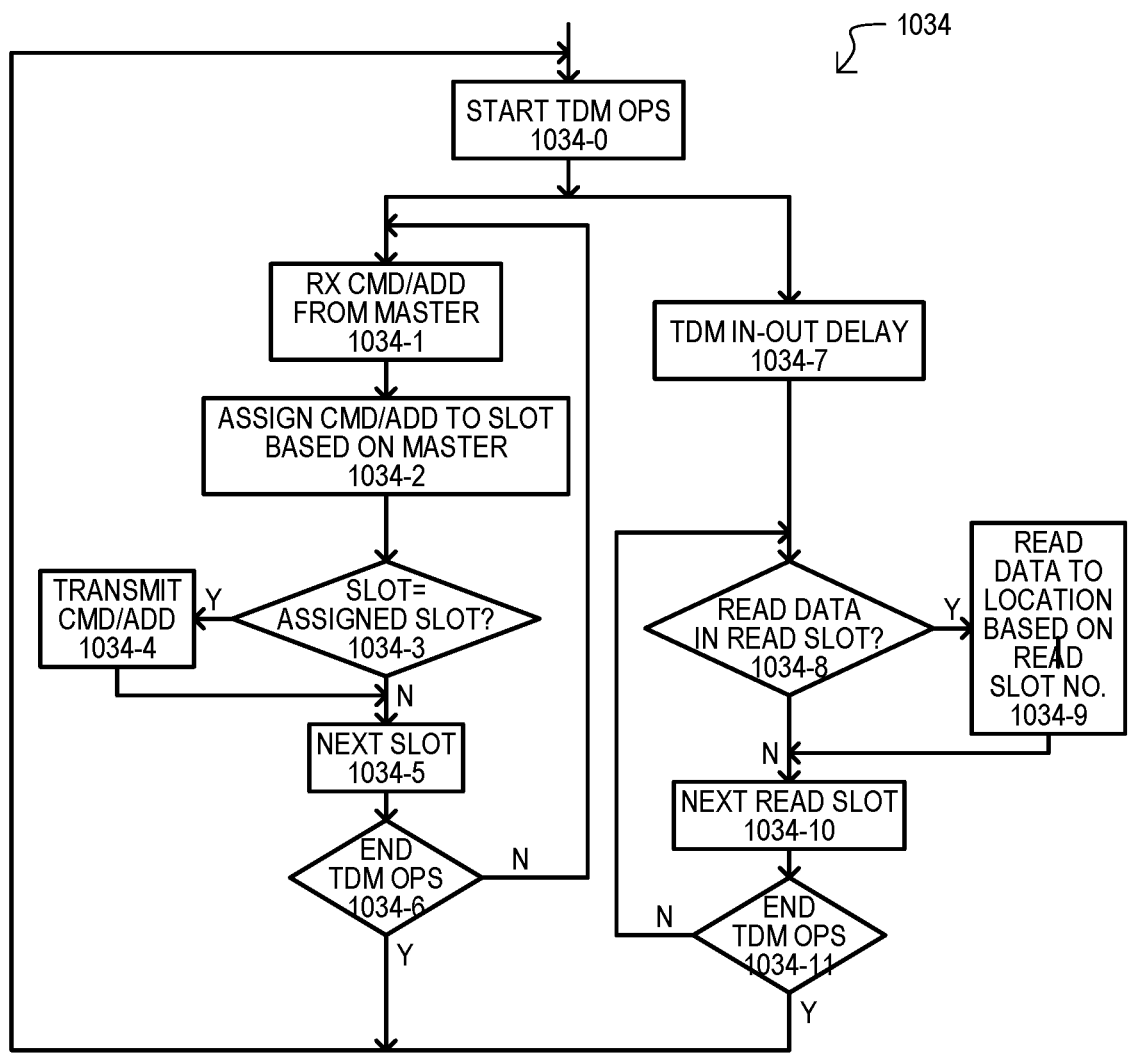
FIG. 10 is a flow diagram of a method according to an embodiment.

FIG. 10 is flow diagram of a method 1034 according to an embodiment. A method 1034 can include starting TDM operations between a processor device and a NVM device 1034-0. Such an action can include starting a particular mode in the processor device and/or configuring an NVM device. In some embodiments, such an action can include assigning masters to particular TDM slots. Masters can be different processes running on a processor device having the need to access NVM storage locations. Further, such an action can include assigning address ranges (e.g., banks) to masters.

Once TDM operations have begun, a method 1034 can determine when command address data is received from a master 1034-1. Received command address data can be assigned to a particular TDM slot based on the master (i.e., origin of the CMD/ADD) 1034-2.

As a method 1034 cycles through TDM slots, it can determine if a current TDM slot is that assigned to the received command-address data 1034-3. If the current TDM slot is the assigned TDM slot (Y from 1034-3), the method 1034 can transmit the command-address data to the NVM device 1034-4. If the current TDM slot is not the assigned TDM slot (N from 1034-3), the method 1034 can advance to the next TDM slot 1034-5. If TDM operations are not concluded (N from 1034-6), a method 1034 can return to receive command address data from a master 1034-1.

Once TDM operations have begun, a method 1034 can also start a TDM IN-OUT delay timer 1034-7. Such a timer can indicate when a TDM read data sequence will start. If read data is detected in a TDM read data slot (Y from 1034-8), the data can be read to the assigned location based on its TDM read slot number 1034-9. If read data is not detected (N from 1034-8), a method can advance to a next TDM read data slot 1034-10. If TDM operations do not end (N from 1034-11) a method 1034 can advance to a next TDM read data slot.

Figure 11:
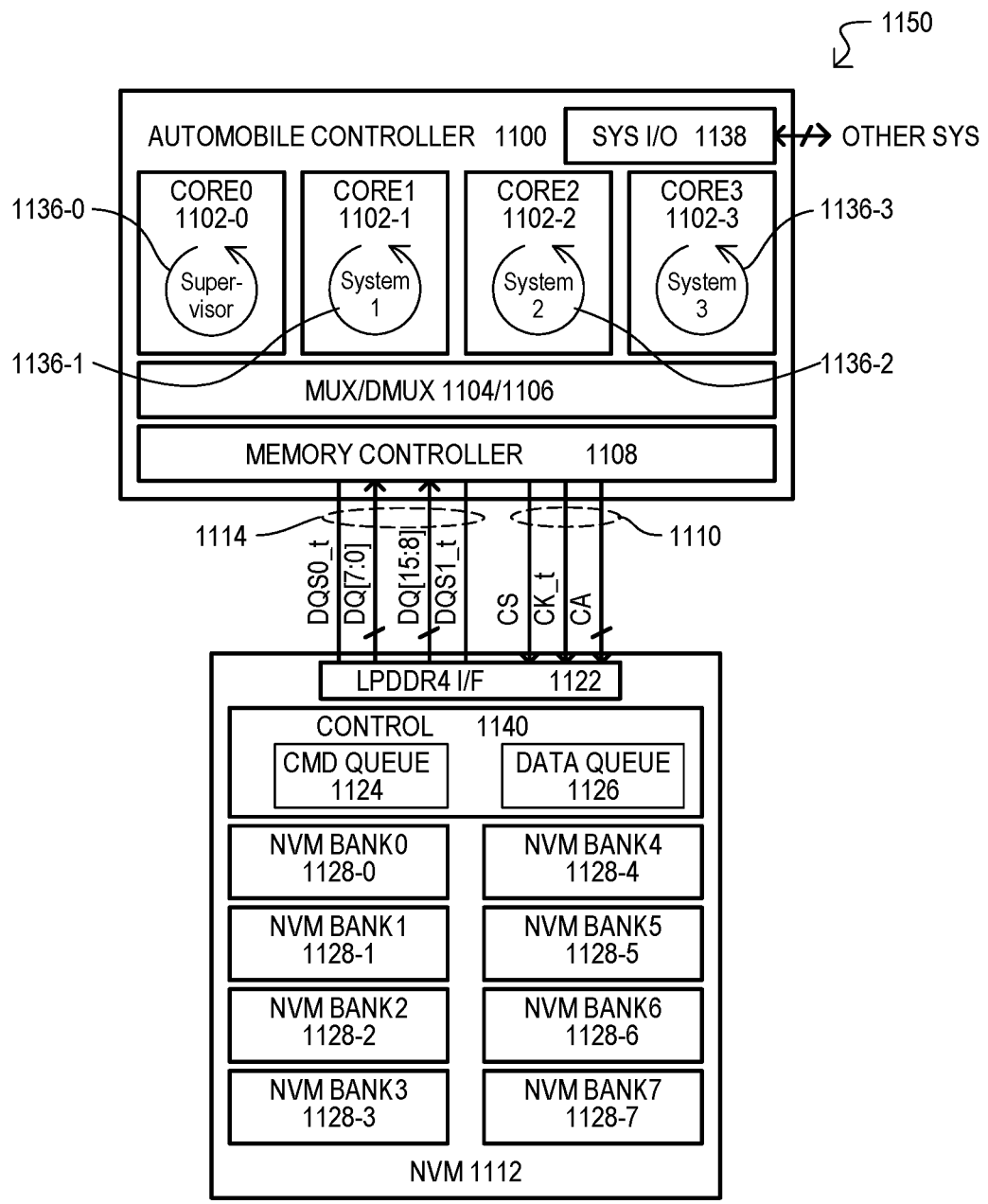
FIG. 11 is a diagram of an automobile control system according to embodiments.

FIG. 11 is a block diagram of an automobile control system 1150 according to another embodiment. System 1150 can be one example of that shown in FIG. 1A/B or 2. System 1150 can include processing cores 1102-0 to -3, MUX and DMUX 1104/1106, memory controller 1108, and system I/Os 1138. Cores (1102-0 to -3) can include processors and associated circuits (e.g., cache memory, buses, etc.). In some embodiments, some cores (1102-1 to -3) can be dedicated to processing tasks (1136-1 to -3) for one or more systems of an automobile, while one or more other cores (1102-0) can execute a supervisory function 1136-0 to oversee and/or monitor the various operations of the system 1150. A memory controller 1108 can be connected to command-address bus 1110 and data bus 1114. System I/Os 1138 can be connected to various automobile systems to receive data from and/or transmit data to such other automobile systems. System I/Os can include interfaces for any suitable bus system, including but not limited the Controller Area Network (CAN) type buses.

A command-address bus 1110 can include a chip select CS, input clock CK_t, and command-address data CA. A data bus can include a first set of data I/Os DQ[7:0] that output data in synchronism with a first data clock DQS0_t, and a second set of data I/Os DQ[15:8] that output data in synchronism with a second data clock DQS1_t.

NVM device 1112 can include a LPDDR4 I/F 1122, control circuits 1140, and a number of separately accessible NVM banks 1128-0 to -7. NVM device 1112 can take the form of and/or operate in the same fashion as any of the NVM devices described herein and equivalents. A control circuits 1140 can include a command queue 1124 can and data queue 1126.

In an operation, cores 1102-0 to 1102-3 can be assigned NVM banks 1128-0 to -7 according to any of the embodiments described herein or equivalents. Further, cores (1102-0 to 1102-3) can be assigned TDM slots according to their processing requirements, including some cores having greater bandwidth than others. In particular, core 1140-0, which can be executing a supervisory function 1136-0, can be assigned a bandwidth suitable for its supervisory needs, including ensuring a predetermined latency.

Within automobile controller 1100, processes 1136-0 to -3 can issue memory read requests as needed. Such requests can be output in assigned TDM slots by MUX 1104. Memory controller 1108 can output such requests on command address bus CA while CS is active. Data on CA can be output in command sequences in synchronism with input clock CK_t. In some embodiments, each command can be input on two CK_t cycles. Signals on command-address bus 1110 can be compatible with the LPDDR4 standard.

Within NVM device 1112, TDM requests can be received by LPDDR4 I/F 1122 and stored in command queue 1124. NVM banks (1128-0 to -7) can then be accessed according to such requests. NVM banks (1128-0 to -7) can be accessed separately as described for embodiments herein. In response to a received request from automobile controller 1100, NVM device 1112 can output data to data queue 1126. Data in data queue 1126 can be driven by LPDDR4 I/F 1122 on data bus 1114. In particular, data on DQ[7:0] can be output on rising and falling edges or data clock DQS0_t and data on DQ[15:8] can be output on rising and falling edges or data clock DQS1_t.

Within automobile controller 1100, read data received on data bus 1114 can be organized into TDM read slots. Processes (1136-0 to -3) can read data from their assigned TDM read slots.

Figures 12A, 12B:
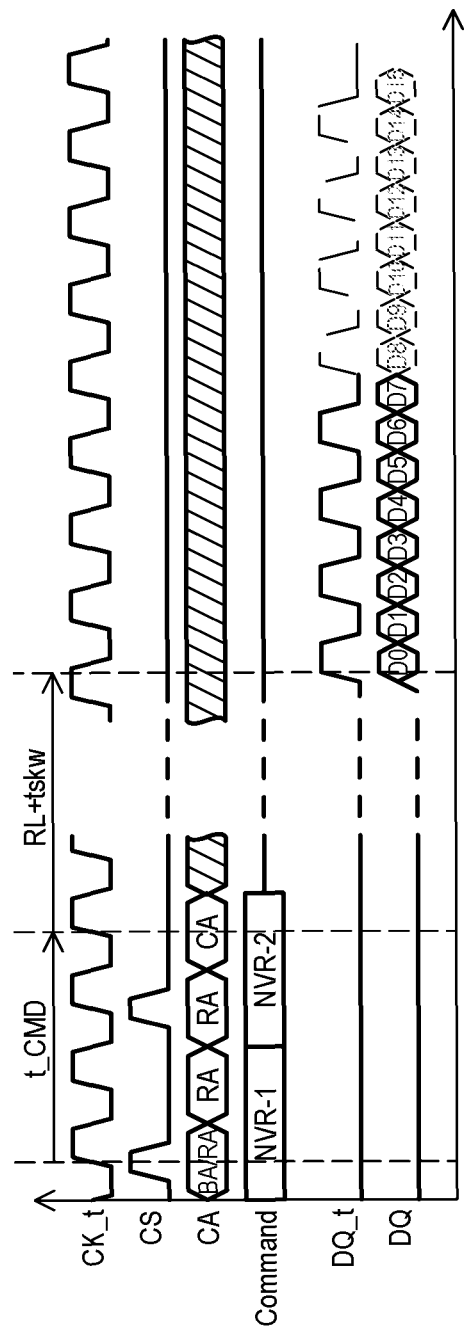
FIGS. 12A and 12B are diagrams showing read commands that can be included in embodiments.

FIGS. 12A and 12B are diagrams showing memory request operations that can be generated by a processor device according to an embodiment. FIG. 12A is a timing diagram showing one type of read access over an LPDDR4 interface according to an embodiment. FIG. 12A includes waveforms for an input clock (CK_t), a chip select CS, command-address values (CA), corresponding commands (Command) (generated by the CA values), a data clock DQ_t, and data values DQ, which are understood to be sets of parallel data values (e.g., bytes, words, doublewords, etc.).

FIG. 12A shows an example of custom read commands that can make accesses faster than a standard LPDDR4 sequence. As shown, two commands (NVR-1-NVR-2) can be received at the LPDDR4 interface over four cycles of CK_t (adding three cycles to an overall latency). Following a read latency and clock skew time period (RL+tskw) data (DQ) can be output at a double data rate in synchronism with a data clock (DQ_t). In the embodiment shown, the data can be output in a burst sequence of eight or greater (e.g., 16).

In some embodiments, a read latency (RL) for access to NVM cells can be accomplished at very high speeds, less than 20 ns or about 17.5 ns. A tskw value can be less than 4 ns, or about 2.5 ns. Accordingly, for a clock (CK_t) speed of 800 MHz, from the latching of a first command portion to the output of data can be as little as 19 clock cycles (t_CMD=3 cycles, RL=14 cycles, tskw=2 cycles). A fast command sequence, like that shown in FIG. 12A can enable rapid accesses to be performed one after the other.

FIG. 12B is a table showing a command sequence for accessing NVM cells (e.g., a bank) that can be generated by a processor device in embodiments. The command sequence can include only two commands: NVR-1 and NVR-2. This is in contrast to conventional LPDDR4 read commands which can include four commands (Activate1-Activate2-Read1-CAS2). FIG. 12 includes columns COMMAND that identifies a type of command, CS which identifies a chip select value, command/address bus values (CA0 to CA5) and clock values CK. As shown, each command includes a set of bit values applied on a first clock transition (CK=1) and the immediately following next clock transition (CK=2) of the same type (e.g., rising edge). Such commands can be received on a LPDDR4 compatible interface and take the general form of an LPDDR4 command. However, NVR-1 and NVR-2 are not part of the LPDDR4 standard.

In the particular embodiment shown, a first command NVR-1 can include higher order address values (e.g., bank and row values), while a second command NVR-2 can include lower order address values (e.g., row and column values). However, the particular bit format of the commands should not be construed as limiting.

Figure 13:
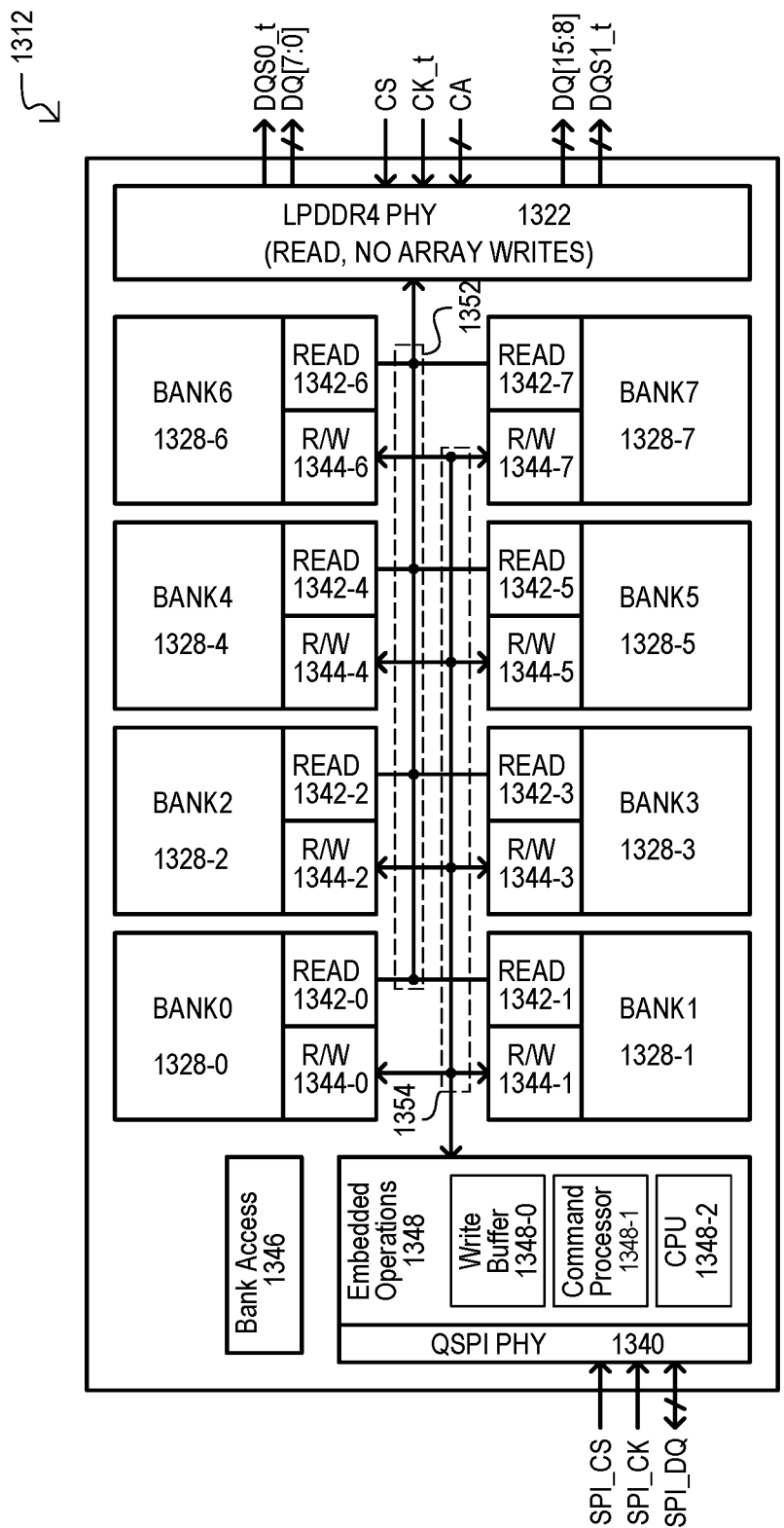
FIG. 13 is block diagram of a NVM device that can be included in embodiments.

FIG. 13 is a block diagram of a NVM device 1312 that can be included in systems according to embodiments. NVM device 1312 can be one implementation of those shown in embodiments herein. NVM device 1312 can include a LPDDR4 compatible PHY (referred to as LPDDR4 PHY) 1322, a QSPI compatible PHY (referred to as QSPI PHY) 1340, multiple banks 1328-0 to -7, a first access path 1342-0 to -7 for each bank (1328-0 to -7), a second access path 1344-0 to -7 for each bank (1328-0 to -7), a bank access register 1346, and an embedded operations section 1348.

LPDDR4 PHY 1322 can receive a chip select CS, clock input CK_t, command address CA input, and output a first data output DQ[7:0] with corresponding data clock output DQS0_t, and a second data output DQ[15:8] with corresponding data clock output DQS1_t. In some embodiments, LPDDR4 PHY 1322 can process some LPDDR4 compatible commands, but not process LPDDR4 write commands. LPDDR4 PHY 1322 can be connected to the banks (1328-0 to -7) via first bus system 1352. A read data transfer rate via LPDDR4 PHY 1322 can be faster than that of QSPI PHY 1340. In some embodiments, LPDDR4 PHY 1322 can be in communication with embedded operations section 1348 to signal access requests via LPDDR4 PHY 1322.

QSPI PHY 1340 can process received commands received over serial data lines. Such commands can include both read and write (e.g., program) commands.

A bank access register 1346 can store bank access data for each bank (1328-0 to -7) that can control access to the bank. In some embodiments, if bank access data for a bank (1328-0 to -7) has one value, the bank can be accessed via QSPI PHY 1340 and not accessed by the LPDDR4 PHY 1322. If bank access data has another value, the bank can be accessed by LPDDR4 PHY 1322 and not accessed by the QSPI PHY 1340.

Each bank (1328-0 to -7) can include NVM cells arranged into rows and columns, and can be separately accessible via a unique bank address. In some embodiments, NVM cells can be group erasable (e.g., flash type cells). Read paths (1342-0 to -7) can enable read accesses to their corresponding bank (1328-0 to -7) from LPDDR4 PHY 1322 via first bus system 1352. R/W paths (1344-0 to -7) can enable read or write accesses to their corresponding bank (1328-0 to -7) from QSPI PHY 1340 via second bus system 1354. In some embodiments, read paths (1342-0 to -7) and R/W paths (1344-0 to -7) can be enabled or disabled according to bank access values. Different banks (1328-0 to -7) can be accessed at the same time.

Embedded operations section 1348 can include a write buffer 1348-0, command processor 1348-1 and processor section 1348-2. A write buffer 1348-0 can receive and store write data from QSPI PHY 1340 for subsequent programming into an addressed bank (1328-0 to -7). A command processor 1348-1 can decode command data received on QSPI PHY 1340 and generate appropriate control signals to execute the command. A processor section 1348-2 can include one or more central processing units (CPUs) to execute various functions for the NVM device 1312. Such functions can include setting bank access values. Further, processor section 1348-2 can provide for any of: maintenance NVM cells (e.g., wear leveling), sector access control (boot sectors), encryption/decryption, as but a few examples.

Figure 14:
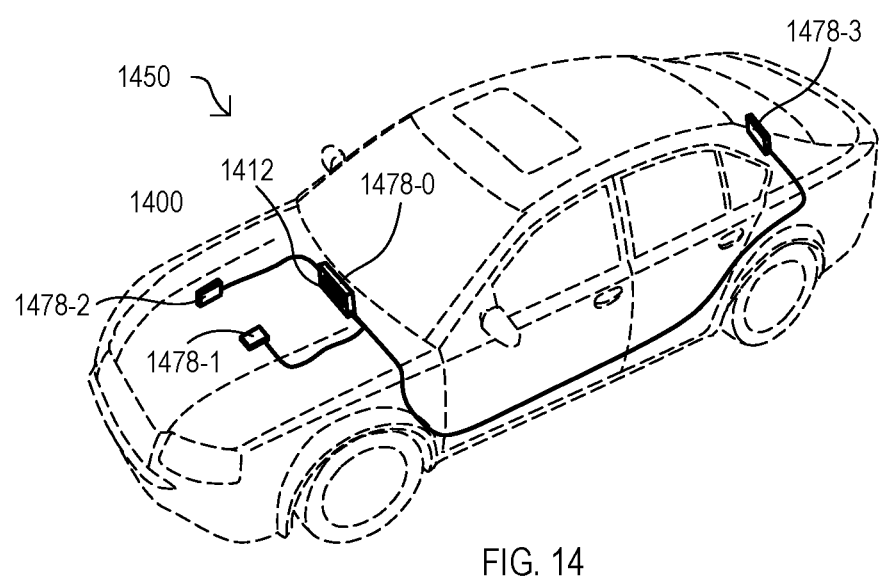
FIG. 14 is a diagram of an automobile system according to an embodiment.

FIG. 14 shows an automobile system 1450 according to an embodiment. Automobile system 1450 can have numerous sub-systems, including but not limited to a main control subsystem 1478-0, engine-power train control system 1478-1, a suspension-tire control system 1478-2, a body control system 1478-3. A main control subsystem 1478-0 can include a processor device 1400 and a NVM device 1412 according to embodiments disclosed herein, or equivalents. A main control subsystem 1478-0 can control infotainment functions (navigation, communication, entertainment devices, data storage, digital audio broadcast) as well as supervisory monitoring of all other systems. In some embodiments, a main control subsystem 1478-0 can be one implementation of that shown in FIG. 11. In such an arrangement, a processor device 1400 can have multiple processes that can access banks of NVM device 1412 in a TDM arrangement and receive read data from NVM device 1412 in a TDM arrangement, as described herein and equivalents. In particular, a supervisory process can have relatively rapid access (LPDDR4 compatible signaling) to NVM device 1412 within some maximum latency.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A device, comprising:
   a plurality of processing cores;
   memory circuits configured to store
   time division multiplexer (TDM) assignment data that assigns each of a plurality of TDM command slots to one of the processing cores in a predetermined order, without more than one processing core being assigned to the same TDM command slot, and
   core assignment data that assigns the same processing cores to different nonvolatile memory (NVM) banks;
   a multiplexer (MUX) configured to order read requests to the different NVM banks from the plurality of processing cores into a sequence of TDM command slots according to the TDM assignment data and the core assignment data; and
   a memory controller configured to:
   generate NVM command and address data from read requests received from the MUX during the TDM command slots assigned to the read requests on a unidirectional command-address bus, the address data including at least a bank address, and
   receive read data on a unidirectional parallel data bus in synchronism with rising and falling edges of a received data clock, the read data being received in TDM read slots having the predetermined order assigned by the TDM assignment data; and
   a demultiplexer (DMUX) configured to provide the read data of each TDM read slot to one of the processing sources based on the TDM read slot position in the predetermined order.

2. The device of claim 1, the processing cores are different processing cores of a single host device.

3. The device of claim 1, wherein:
   each processing core issues read requests only to addresses of assigned banks of a NVM device; and
   a bank is assigned to no more than two processing sources.

4. The device of claim 3, wherein the MUX is configured to prevent different processing cores from being assigned consecutive TDM read slots for accesses to the same bank.

5. The device of claim 1, wherein:
   a plurality of the processing cores are subsystem control processes that each control subsystems of a larger system; and
   at least one of the processing cores is a supervisory process that monitors the subsystem control processes.

6. The device of claim 5, wherein the device is an automobile controller and the subsystems are subsystems of an automobile.

7. The device of claim 1, wherein the unidirectional command-address bus and the unidirectional parallel data bus are compatible with signaling according to the LPDDR4 standard.

8. A method, comprising:
   assigning different nonvolatile memory (NVM) banks to different control processes of a controller device according to core assignment data, each control process issuing access requests only to an assigned NVM bank;
   storing time division multiplexer (TDM) assignment data that assigns each of a plurality of TDM command slots to one of the control processes in a predetermined order, without more than one control process being assigned to the same TDM command slot;
   multiplexing access requests from the control processes into a sequence of command slots according to the TDM assignment data and the core assignment data;
   by operation of a memory controller circuit of the controller device;
   generating command and address data from access requests received from the MUX during the assigned TDM command slots on a unidirectional command-address bus, and
   receiving read data on a unidirectional parallel data bus in synchronism with rising and falling edges of a received data clock, the read data being received in TDM read slots having the predetermined order assigned by the TDM assignment data; and
   demultiplexing the read data from each TDM read slot to the one of the control processes based on the TDM read slot position in the predetermined order.

9. The method of claim 8, wherein each control processes comprises a process executed by a processor core.

10. The method of claim 8, wherein if a bank is assigned to more than one control process, access requests to the bank by different assigned control processes do not occur on consecutive TDM command slots.

11. The method of claim 8, wherein the memory controller receives and transmits data with signaling compatible with the LPDDR4 standard.

12. The method of claim 8, wherein:
    the command and address data are transmitted as sequences of commands, each command including command and/or address values transmitted over two clock cycles of an input clock; and
    generating command and address data includes executing read operations to a bank with no more than two commands.

13. The method of claim 8, wherein:
    the predetermined order of the TDM command slots repeats over time; and at least one of the control processes is assigned to more TDM command slots than another of the control processes.

14. The method of claim 8, wherein:
the controller device is an automobile controller device;
a plurality of the control processes are configured to control subsystems of an automobile; and
at least one control process is a supervisory process that monitors the other control processes.

15. A system, comprising:
a processor device that includes
a plurality of processor cores,
memory circuits configured to store
time division multiplexer (TDM) assignment data that assigns each of a plurality of TDM command slots to one of the processor cores in a predetermined order, without more than one processor being assigned to the same TDM command slot, and
core assignment data that assigns the same processing cores to different nonvolatile memory (NVM) banks,
a multiplexer (MUX) configured to order read requests from the processor cores into a sequence of command slots according to the TDM assignment data and the core assignment data,
a memory controller configured to:
generate NVM command and address data in response to the read requests from the MUX, and
receive read data in TDM read slots having the predetermined order established by the TDM assignment data, and
a demultiplexer (DMUX) configured to provide the read data of each TDM read slot to one of the processor cores;
a NVM device that includes a plurality of separately addressable banks;
a unidirectional command-address bus configured to transmit the command and address data from the processor device to the NVM device; and
a unidirectional data bus configured to transmit the read data from the NVM device to the processor device.

16. The system of claim 15, wherein:
the TDM command slots are of a same duration;
the NVM device has a bank access time, the bank access time including the time duration between the receipt of command address data, and the output of corresponding read data; and
the TDM command slot duration is less than the bank access time.

17. The system of claim 15, wherein the NVM device is configured to:
in response to receiving the read requests from the processor device to different banks on consecutive TDM command slots, accessing a first of the separately addressable banks while accessing a second of the separately addressable banks.

18. The system of claim 15, wherein:
the core assignment data assigns the separately addressable banks of the NVM device to no more than two processor cores; and
the processor device is configured to
restrict each processor core to accessing only one of the separately addressable banks assigned, and
prevent accesses in consecutive TDM command slots to be issued to a same separately addressable bank.

19. The system of claim 15, wherein:
the processor device is an automotive controller device;
each of the plurality of processor cores is configured to execute a subsystem control process to control an automotive subsystem; and
at least one processor core is configured as a supervisory process that monitors the subsystem control processes, the supervisory process having at least one dedicated TDM command slot.

20. The system of claim 15, wherein the unidirectional command-address bus and unidirectional data bus are compatible with the LPDDR4 standard.

* * * * *